(12) United States Patent
Tong

(10) Patent No.: US 7,291,282 B2
(45) Date of Patent: Nov. 6, 2007

(54) METHOD OF FABRICATING A MOLD FOR IMPRINTING A STRUCTURE

(75) Inventor: William M. Tong, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 262 days.

(21) Appl. No.: 11/070,064

(22) Filed: Mar. 1, 2005

(65) Prior Publication Data

US 2006/0198919 A1   Sep. 7, 2006

(51) Int. Cl.
*B44C 1/22* (2006.01)
(52) U.S. Cl. .............................. 216/40; 216/84; 216/90; 216/92; 216/95; 438/735; 438/750
(58) Field of Classification Search .................. 216/40, 216/84, 90, 92, 95; 438/735, 750
See application file for complete search history.

(56) References Cited

U.S. PATENT DOCUMENTS

| | | | |
|---|---|---|---|
| 6,294,450 B1 | 9/2001 | Chen et al. | |
| 6,407,443 B2 | 6/2002 | Chen | |
| 6,755,984 B2 | 6/2004 | Lee et al. | |
| 6,773,616 B1 | 8/2004 | Chen et al. | |
| 6,960,489 B2 * | 11/2005 | Bernds et al. | ................. 438/99 |
| 2006/0186084 A1 * | 8/2006 | Wang et al. | ................... 216/11 |

* cited by examiner

*Primary Examiner*—Binh X. Tran

(57) ABSTRACT

The present invention provides a method of fabricating an imprint mold for molding a structure. The method includes directing a first and a second flux for forming a first material and a second material, respectively, to a substrate to form a layered structure having alternating layers of the first and the second material. The method also includes controlling a thickness of the first and the second layers by controlling the first and the second flux and cleaving the layered structure to form a cleavage face in which sections of the layers are exposed. The method further includes etching the exposed sections of the layers using a etch procedure that predominantly etches one of the first and the second materials to form the mold having an imprinting surface with at least one indentation for molding the structure. At least one of the fluxes is controlled so that at least one of the layers has a thickness that varies along a portion of a length of the at least one layer.

20 Claims, 4 Drawing Sheets

METHOD OF FABRICATING A MOLD FOR IMPRINTING A STRUCTURE

FIELD OF THE INVENTION

The present invention relates generally to a method of fabrication an imprint mold for molding a structure. The present invention relates particularly, though not exclusively, to a method of fabricating a nano-imprint mold for molding a nano-scale structure.

BACKGROUND OF THE INVENTION

It is now recognized that performance increase and miniaturization of electronic devices are not unlimited. A limit is reached when the size of device elements is so small that quantum physics effects become apparent and the device does not operate in a manner that is expected from classical physics.

Alternative technologies are being considered to enable fabrication of new devices and the field of molecular electronics is one field that is of particular interest. Selected types of molecules may be used as switches and have a size that is much smaller than that of conventional switches.

To contact such molecular switches in a device structure, nano-scale wires may be used as their size is compatible with the small scale of the molecular switches. The fabrication of such nano-wires, however, is very difficult. One procedure to fabricate such nano-wires involves usage of an imprint mold. Such an imprint mold may be formed from a layered structure which has an imprint surface that includes sections of the layers. Etching procedures are used to form indentations in the imprint surface which can be used for molding nano-structures for forming the nano-wires.

For many device structures, such as those having "fan out" contacting layers or wires, it would be advantageous to produce such nano-wires or contacts so that their width varies along their length. Fabrication of such structures is even more challenging than that of straight nano-wires and consequently there is a need for technological advancement.

SUMMARY OF THE INVENTION

Briefly, an embodiment provides a method of fabricating an imprint mold for molding a structure. The method includes directing a first and a second flux for forming a first material and a second material, respectively, to a substrate to form a layered structure having alternating layers of the first and the second material. The method also includes controlling a thickness of the first and the second layers by controlling the first and the second flux and cleaving the layered structure to form a cleavage face in which sections of the layers are exposed. The method further includes etching the exposed sections of the layers using an etch procedure that predominantly etches one of the first and the second materials to form the mold having an imprinting surface with at least one indentation for molding the structure. At least one of the fluxes is controlled so that at least one of the layers has a thickness that varies along portion of a length of the at least one layer.

The invention will be more fully understood from the following description of embodiments of the invention. The description is provided with reference to the accompanying drawings.

DETAILED DESCRIPTION OF EMBODIMENTS

Figure 1:
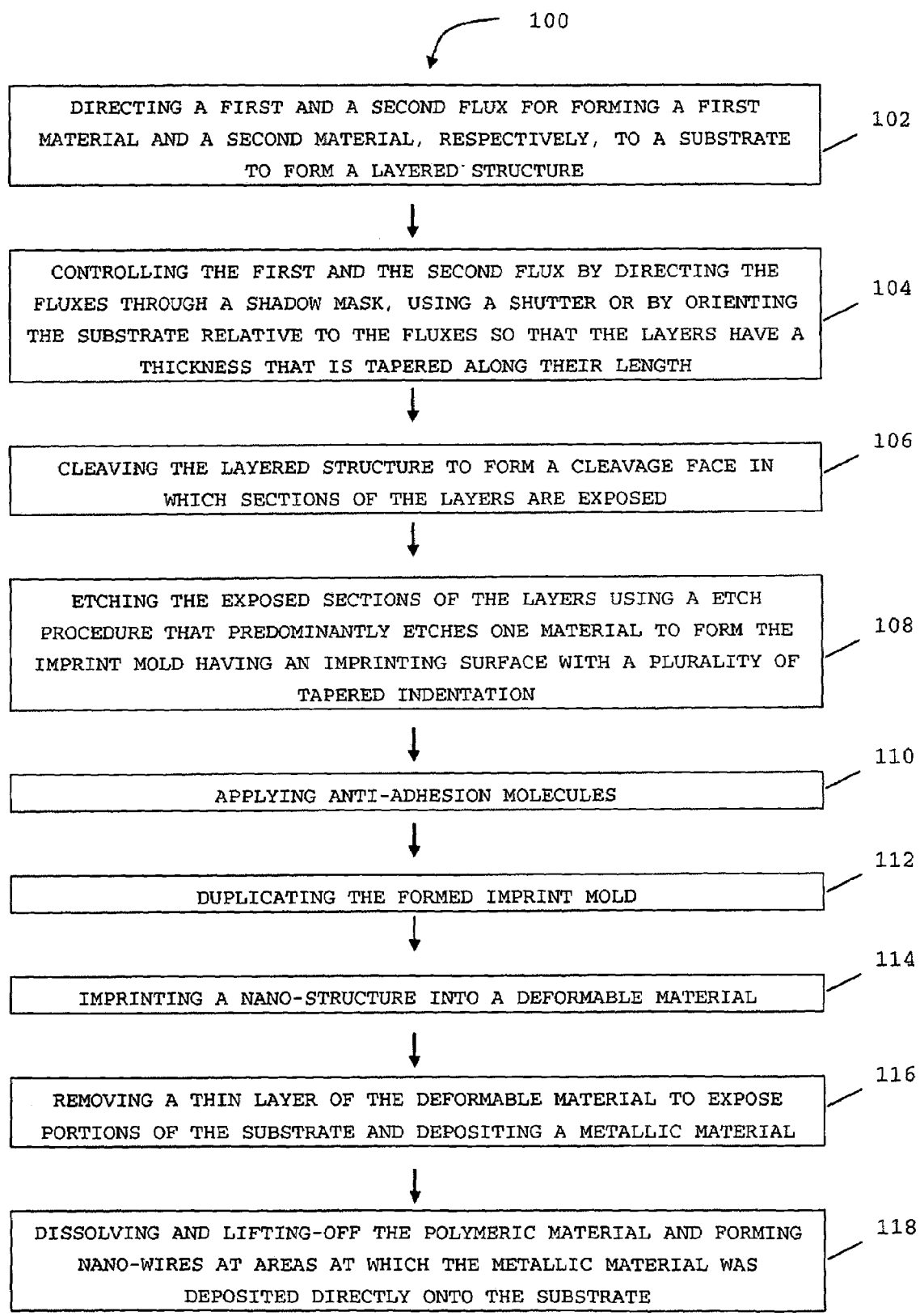
FIG. 1 is a flow chart illustrating a method of fabricating an imprint mold for molding a structure according to an embodiment of the present invention.

Referring initially to FIG. 1, a method of fabricating an imprint mold for molding a structure according to an embodiment is now described. The method 100 includes the step 102 of directing a first and a second flux for forming a first and a second material, respectively, to a substrate. For example, the fluxes may originate from physical vapour sources or chemical vapour sources. Examples for the flux sources include any type of thermal evaporator, such as electron beam evaporators, any type of physical sources, such as ion-sputtering target sources, or chemical vapour deposition sources. For example, the flux may include the material in a molecular or atomic vapour form or may include chemical precursors for forming the materials.

The first and the second material differ from each other and one of the first and the second materials has a higher etching rate for a suitable etching procedure than the other material. For example, the first material may be silicon (or an alloy thereof) and the second material may be $SiO_2$; the latter can be selectively etched using a HF solution. Alternatively, the first material may be aluminium and the second material may be tantalum; the latter can be selectively etched by electrolysis. In a further variation the first material may be platinum and the second material may be chromium; the latter can be selectively wet-etched by a "photomask" etching process or dry-etching process such as Reactive Ion Etching (RIE).

The materials typically are deposited on the substrates so that a layered structure is formed that includes alternating layers of the first and second material. It is to be understood that in variations of this embodiment any number of different materials may be deposited on the substrate. Consequently, the method 100 may also include directing more than two fluxes to the substrate.

The method 100 also includes the step 104 of controlling the first and the second flux. The fluxes are controlled so that layers having a predetermined thickness are formed on the substrate. For example, this may be conducted by regulating the material fluxes themselves by controlling the temperature of a thermal evaporator. Additionally, the-fluxes are controlled to deposit the layers on the substrate in a manner such that a thickness of each layer varies across a length of the layer.

For example, more flux may be directed to a first area of the substrate and less flux may be directed to a second area of the substrate. Consequently, the layers formed on the second area of the substrate have a thickness that is smaller than those formed on the first portion. This may be achieved by using a shutter to partially shutter off flux at the second portion of the substrate or the fluxes may be directed through a shadow mask which has one or a plurality of openings arranged so that the fluxes are directed to the substrate to form layers having a predetermined thickness variation across the substrate. Alternatively, the flux sources may be positioned relative to the substrate so that the first area of the substrate receives more flux than the second area of the substrate. Both the shadow mask or the shutter may also be moved during deposition to control the fluxes and to improve a thickness uniformity or a uniformity of a thickness variation.

It is to be appreciated that in a variation of this embodiment only one type of material flux may be controlled so that a thickness of only one material varies across the substrate in a predetermined manner. In a further variation of the embodiment, more than two fluxes may be controlled in this manner. In addition, it is to be appreciated that the fluxes may be directed to the substrate so that the layers have thicknesses that vary across the substrate in an undulating manner or in any other manner.

In this embodiment, the layers have a thickness that is tapered along a length of the layers. After the layers are formed, the formed layered structure on the substrate is cleaved in a manner such that sections of each layer are exposed (step 106).

In step 108 the layered sections are exposed to an etching process which typically is a wet etching process, but may alternatively be RIE or an electrolytic etch process. The materials of the layered structure and the etching process are selected so that one material is predominantly etched compared with another material and indentations are formed at the sections of those material layers which etch faster than others. These indentations provide molds for molding a structure in a soft material.

For example, in step 104 the layer thicknesses may be controlled so that their thicknesses are in the nano-scale range. In this case, a width of the indentations would be of the same magnitude and the etched sections of the layers would provide a mold for molding a nano-structure. Throughout this specification the term "nano" is used for a structure having a dimension, or having a component that has a dimension, that is smaller than 1 μm.

The width of the indentation typically is of the order of 10 nm and may in variations of this embodiment be 1 nm to 100 μm. As in this embodiment the layer thickness is tapered, the width of the indentations and/or a distance between adjacent indentations is tapered in the same manner.

Step 110 applies a self-assemble monolayer (SAM) of anti-adhesion molecules to the mold which has protruding —OH termination groups. Such —OH termination groups can be produced by a piranha wet etch with nitric acid and hydrogen peroxide, or by exposure to a water plasma. The SAM has the advantage of reducing the adhesion to material into which a structure is imprinted using the mold and thereby increases the lifetime of the mold.

Step 112 duplicates the formed imprint mold. For example, the mold may be duplicated by imprinting a structure that corresponds to the ridges and indentations of the mold into a deformable material such as a polymeric material or another suitable material. The polymeric material is then hardened. The formed structure may itself serve as a mold forming a structure which is a duplicate of the original mold.

The method 100 further includes the step 114 of imprinting the nano-structure into a deformable material, such as a deformable polymeric material on a substrate, such as a silicon wafer or any other suitable substrate. In step 116, a thin residual layer of the polymeric material is etched away to expose the substrate locally at areas in which the thickness of the polymeric material is very small and which correspond to ridges of the imprint mold. A thin layer of a metal material, such as Ti, Pt, Ag, or Au or any other suitable metal, is then deposited on the substrate.

In step 118 the structure is dipped into a solvent that predominantly dissolves polymeric materials. For example, the solvent may be acetone or any other suitable solvent that dissolves polymeric materials. The structure is then dipped into the solvent and in a lift-off process the solvents lifts off the polymeric material leaving the metallic material at areas where the metallic material was deposited directly onto the substrates. With a mold having suitably shaped indentations nano-wires therefore can be formed on the substrate.

Alternatively, a thin layer of metal that can be etched, such as Cr, is deposited uniformly across a substrate and the deformable polymeric material is then deposited on the metal layer and the nano-structure is then imprinted into the deformable polymeric material. A thin layer of the polymeric material is etched away so that between ridges of the nano-structure the metallic layer is exposed. The exposed metal is etched away using a selective etch process that predominantly etches the metallic material. This leaves a structure of nano-wires buried underneath the remaining polymeric material. The remaining polymeric material is then etched away and the formed nano-wires are exposed.

In this manner, a broad variety of nano-scale device structures may be formed such as contact layers or strips for contacting molecules in molecular switching devices. For example, such molecules may be sandwiched between nano-wires formed by the above method. The tapered nano-wires may, for example, be arranged in a cross-bar arrangement. Alternatively, the tapered nano-wires may be used to contact a molecule or a molecular structure in a fan-out arrangement.

Figure 2:
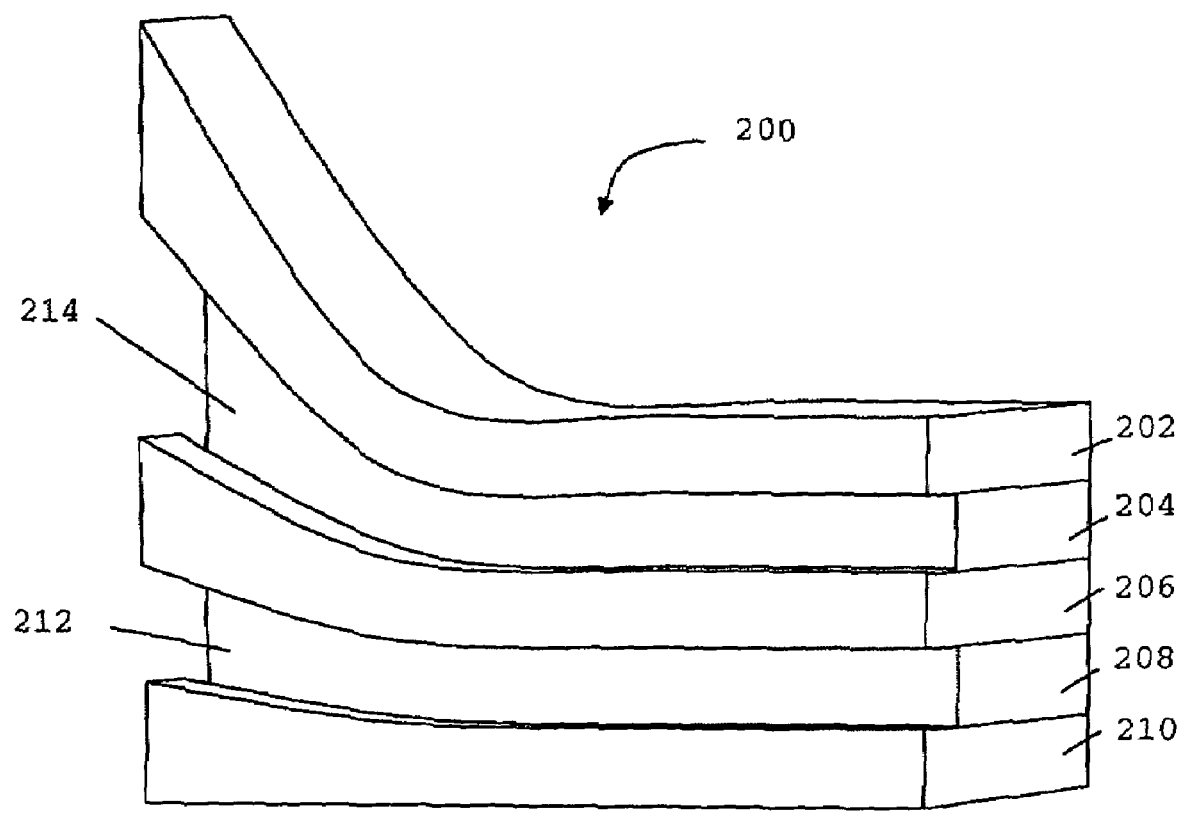
FIG. 2 is a perspective view of an imprint mold for molding a structure according to an embodiment of the present invention.

FIG. 2 shows an imprint mold 200 for molding a structure. The mold 200 was fabricated using the method 100 described above and illustrated in FIG. 1. In this embodiment, the mold 200 includes layers 202, 204, 206, 208 and 210. Layers 202, 206 and 210 are formed from a first material, such as silicon, and layers 204 and 208 are formed from a second material, such as silicon dioxide. Indentations 212 and 214 were formed at sections of layers 204 and 208 using the method 100 described above.

The indentations 212 and 214 have a width that is tapered. Further, the indentations 212 and 214 have in this embodiment a distance between them that is tapered. In this embodiment, the layers 204 and 206 have a thickness of 1 nm to 100 μm so that the mold 200 can be used for imprinting nano-structures that can be used to form nano-wires. In order to improve the clarity, FIG. 2 shows the mold 200 having only five layers. Typically, however, the mold 200 includes a larger number of layers such as from one to five one hundred. Further, a substrate on which the layers were deposited is not shown.

Figure 3:
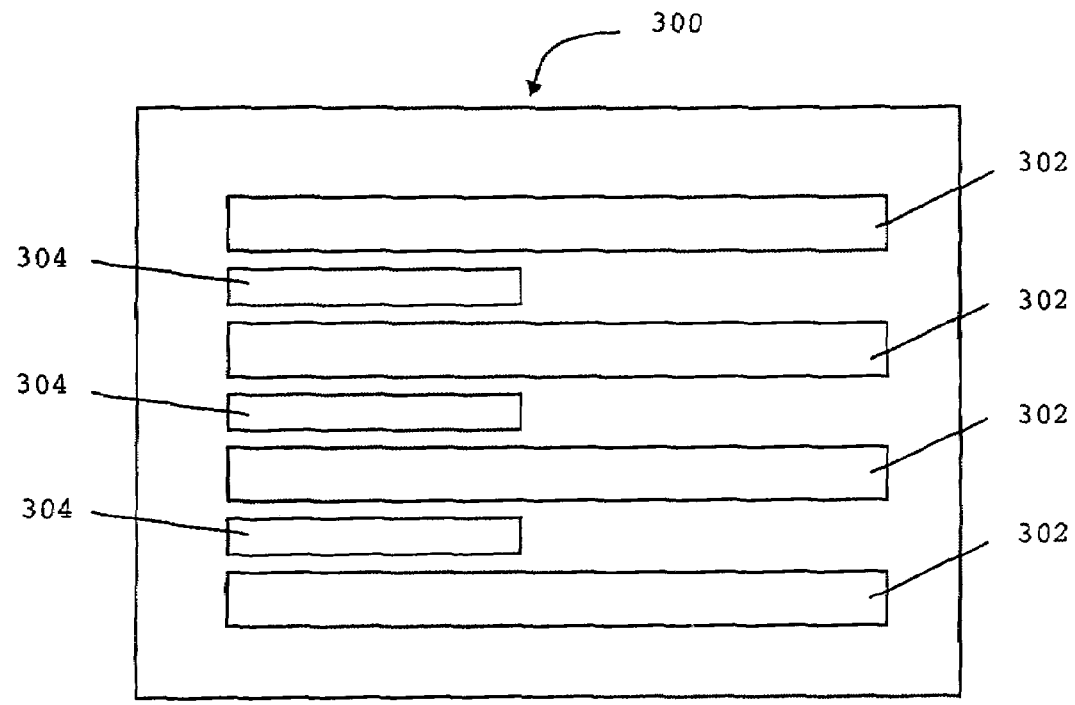
FIG. 3 is a shadow mask according to an embodiment of the present invention.

In one embodiment of the method 100 illustrated in FIG. 1 and described above, the thickness of the layers is controlled using a shadow mask. FIG. 3 shows a shadow mask 300 having openings 302 and 304. In this embodiment, the shadow mask 300 is arranged so that more flux is directed through a left-hand side of the shadow mask as shown in FIG. 3 than through a right-hand side.

Figure 4:
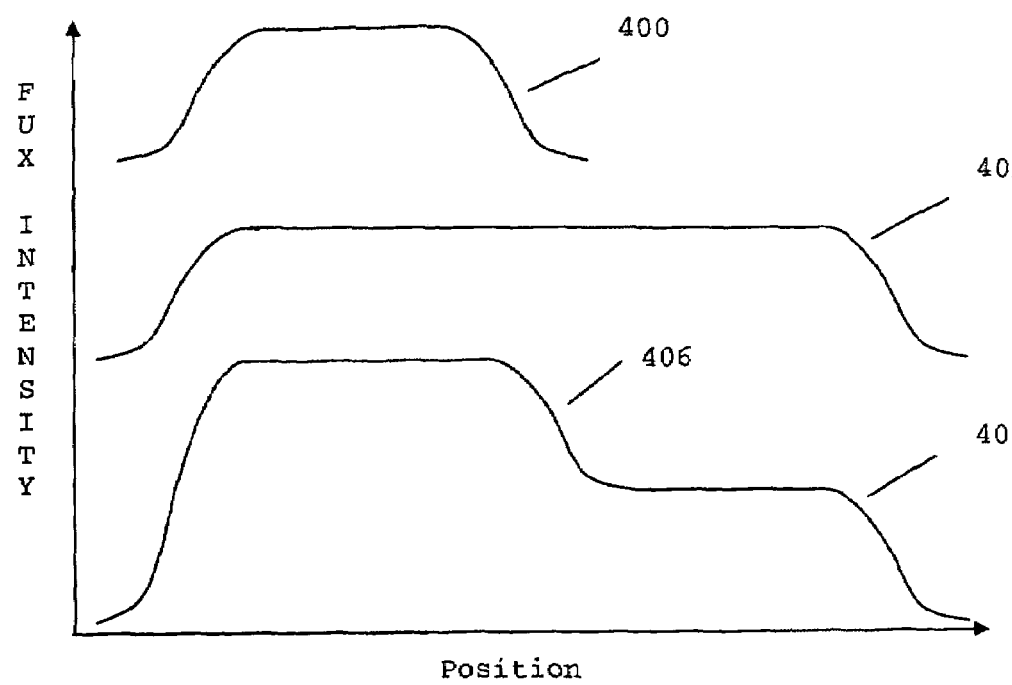
FIG. 4 shows a plot of flux intensity versus position for the shadow mask shown in FIG. 3 according to an embodiment.

FIG. 4 shows a plot for the flux intensity versus position for the mask 300 shown in FIG. 3. Plot 400 shows schematically a typical flux intensity distribution for flux that penetrated through openings 304 of the mask 300 and plot 402 shows schematically a typical flux intensity distribution for flux that penetrated through openings 304 of the mask 300. The resultant total flux is indicated by plot 404 which shows a higher flux intensity on the left hand side than on the right hand side and a region 406 in which the flux is increasing from the right-hand side to the left-hand side. Consequently the thickness of the layers deposited on a substrate from fluxes directed through the shadow mask 300 will have a larger thickness on the left-hand side than on the right-hand side and between the left-hand side and the right-hand is a transitional region in which the layer thickness is tapered.

Figure 5:
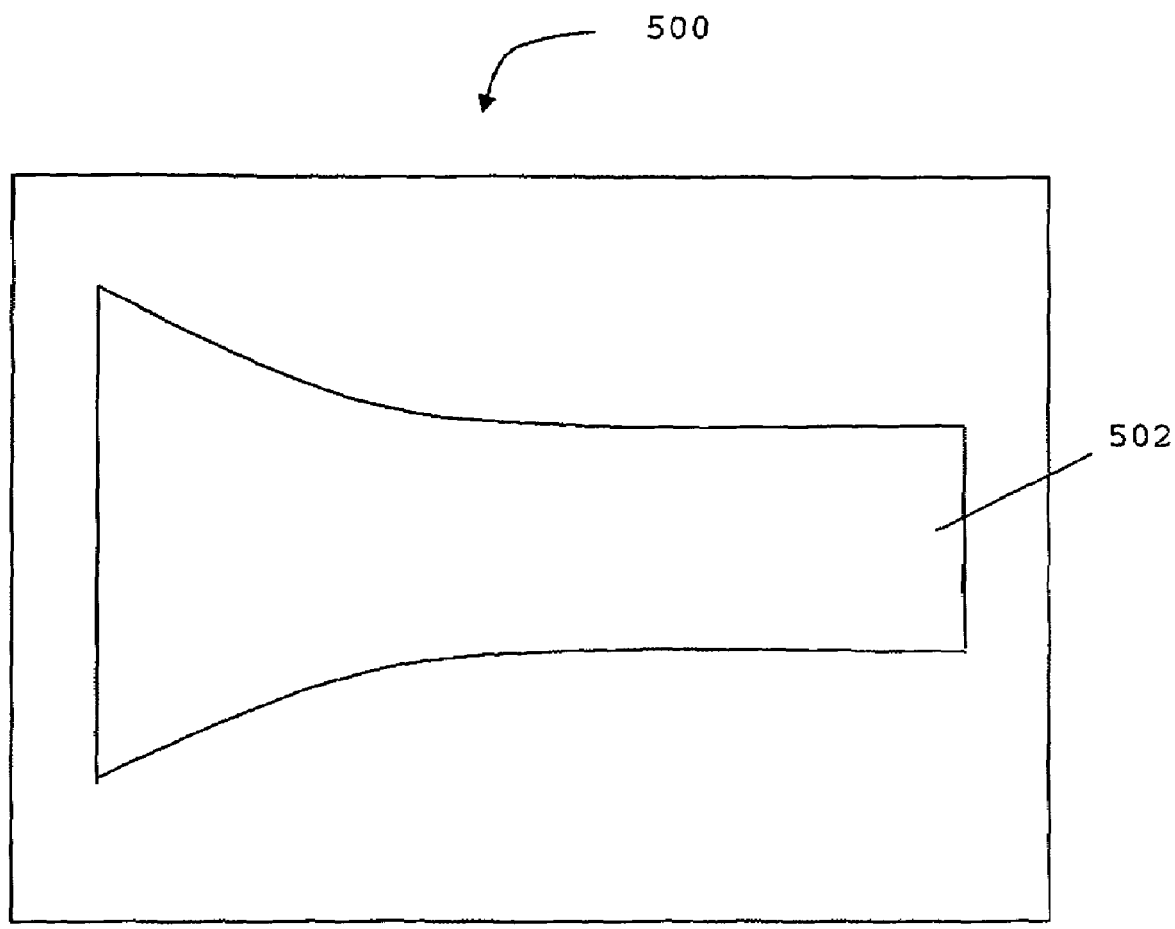
FIG. 5 is a shadow mask according to another embodiment of the present invention.

FIG. 5 shows a further variation of a shadow mask 500. In this case, the shadow mask 500 has only one opening 502 that is tapered. Therefore, if a flux is directed through such a shadow mask, the flux is increasing from a right-hand side to a left-hand side. Layers having a tapered thickness may be deposited on a substrate using the shadow mask 500 if the shadow mask is moved, for example dithered, across the substrate with a speed or period that is large compared with the time for growing on of the layers.

It is to be appreciated that in variations of the embodiment shown in FIGS. 3 and 5, any suitable shadow mask that results in deposition of a layer having a thickness that varies along a length of the layer can be used. For example, a shadow mask having a large number of perforations or a large number of small holes having a variation of diameter across the shadow mask can be used. Further, as discussed above, one or more shutters may be used to control the fluxes.

Although the embodiments have been described with reference to particular examples, it is to be appreciated by those skilled in the art that the embodiments may take other forms. For example, the layered structure may not include silicon or germanium but may instead include any other suitable material such as Ta/Al or Pt/Cr.

What claimed is:

1. A method of fabricating an imprint mold for molding a structure, the method comprising:
   directing a first and a second flux for forming a first material and a second material, respectively, to a substrate to form a layered structure having alternating layers of the first and the second material;
   controlling a thickness of the first and the second layers by controlling the first and the second flux;
   cleaving the layered structure to form a cleavage face in which sections of the layers are exposed; and
   etching the exposed sections of the layers using an etch procedure that predominantly etches one of the first and the second materials to form the mold having an imprinting surface with at least one indentation for molding the structure;
   wherein a shutter is used to shutter a portion of at least one of the first and the second flux so that at least one of the layers has a thickness that varies along a portion of a length of the at least one layer.

2. The method of claim 1, further comprising duplicating the formed mold.

3. The method of claim 1 wherein the shutter is used to shutter the portion of the at least one of the first and the second flux so that the at least one of the layers has a thickness that is tapered along a portion of a length of the layers.

4. The method of claim 1 wherein the at least one of the fluxes is controlled so that a width of the at least one indentation varies along a length of the at least one indentation.

5. The method of claim 4 wherein the at least one of the fluxes is controlled so that a width of the at least one indentation is tapered along a length of the at least one indentation.

6. The method of claim 1 wherein at least one of the layers has nano-scale thickness, and the structure is a nano-scale structure.

7. The method of claim 6 wherein the imprinting surface comprises a plurality of indentations, and the indentations have a width of less than 100 nm.

8. The method of claim 6 wherein the imprinting surface comprises a plurality of indentations, and the indentations have a width of less than 50 nm.

9. The method of claim 6 wherein the imprinting surface comprises a plurality of indentations, and the indentations have a width of less than 10 nm.

10. The method of claim 6 wherein the imprinting surface comprises a plurality of indentations, and the indentations have a width that is tapered from more than 100 µm to less than 100 nm.

11. The method of claim 6, further comprising the step of forming a nano-wire from the nano-structure.

12. A method of fabricating an imprint mold for molding a structure, the method comprising:
    directing a first and a second flux for forming a first material and a second material, respectively, to a substrate to form a layered structure having alternating layers of the first and the second material;
    controlling a thickness of the first and the second layers by controlling the first and the second flux;
    cleaving the layered structure to form a cleavage face in which sections of the layers are exposed; and
    etching the exposed sections of the layers using an etch procedure that predominantly etches one of the first and the second materials to form the mold having an imprinting surface with at least one indentation for molding the structure;
    wherein the imprinting surface comprises a plurality of indentations and wherein a shutter is used to shutter a portion of the first and the second flux so that the layers have a thickness that varies along a portion of a length of the layers.

13. The method of claim 12 wherein the shutter is used to shutter the first and the second flux so that a distance between adjacent indentations varies along a length of the indentations.

14. The method of claim 12 wherein the shutter is used to shutter the first and the second flux so that a distance between adjacent indentations is tapered along a length of the indentations.

15. The method of claim 12 wherein the shutter is used to shutter the first and the second flux so that a distance between adjacent indentations and a width of the indentations varies along a length of the indentations.

16. The method of claim 12 wherein the shutter is used to shutter the first and the second flux so that a distance between adjacent indentations and a width of the indentations are tapered along a length of the indentations.

17. The method of claim 12 wherein the shutter is moved during formation of the layered structure to control at least one of the first and the second flux.

18. The method of claim 12 wherein the shutter is used to shutter the portion of the first and the second flux so that the layers have a thickness that is tapered along a portion of a length of the layers.

19. A method of fabricating an imprint mold for molding a structure, the method comprising:

directing a first and a second flux for forming a first material and a second material, respectively, to a substrate to form a layered structure having alternating layers of the first and the second material;

controlling a thickness of the first and the second layers by controlling the first and the second flux;

cleaving the layered structure to form a cleavage face in which sections of the layers are exposed; and etching the exposed sections of the layers using an etch procedure that predominantly etches one of the first and the second materials to form the mold having an imprinting surface with at least one indentation for molding the structure;

wherein the imprinting surface comprises a plurality of indentations; wherein a portion of the first and the second flux is directed through a shadow mask that controls the first and the second flux so that the layers have a thickness that varies along a portion of a length of the layers; and wherein the shadow mask is moved relative to the substrate during formation of the layered structure to control at least one of the first and the second flux.

20. A method of producing a nano-scale structure, comprising:

directing a first and a second flux for forming a first material and a second material, respectively, to a substrate so that a layered structure having alternating layers of the first and the second material is formed on the substrate, the layers having nano-scale thickness;

controlling a thickness of the first and the second layers by controlling the first and the second flux;

cleaving the layered structure to form a cleavage face in which sections of the layers are exposed;

etching the exposed sections of the layers using a etch procedure that predominantly etches one of the first and the second materials to form an imprinting surface having at least one indentation for molding the nano-scale structure; and imprinting the nano-structure into a deformable material;

wherein a shutter is used to shutter a portion of at least one of the first and the second flux so that at least one of the layers has a thickness that varies along a portion of a length of the at least one layer.

* * * * *

UNITED STATES PATENT AND TRADEMARK OFFICE
CERTIFICATE OF CORRECTION

PATENT NO.        : 7,291,282 B2              Page 1 of 1
APPLICATION NO. : 11/070064
DATED             : November 6, 2007
INVENTOR(S)       : William M. Tong It is certified that error appears in the above-identified patent and that said Letters Patent is hereby corrected as shown below:

In column 1, line 7, delete "fabrication" and insert -- fabricating --, therefor Signed and Sealed this Twenty-third Day of June, 2009

JOHN DOLL
*Acting Director of the United States Patent and Trademark Office*